(12) United States Patent
Jeon et al.

(10) Patent No.: US 7,989,154 B2
(45) Date of Patent: Aug. 2, 2011

(54) POLYMER OR RESIST PATTERN, AND METAL FILM PATTERN, METAL PATTERN AND PLASTIC MOLD USING THE SAME, AND FABRICATION METHODS THEREOF

(75) Inventors: Jin-Wan Jeon, Daejeon (KR); Jun-Bo Yoon, Daejeon (KR); Koeng Su Lim, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 918 days.

(21) Appl. No.: 11/911,897

(22) PCT Filed: Nov. 6, 2006

(86) PCT No.: PCT/KR2006/004591
§ 371 (c)(1),
(2), (4) Date: Oct. 18, 2007

(87) PCT Pub. No.: WO2007/052978
PCT Pub. Date: May 10, 2007

(65) Prior Publication Data
US 2008/0182081 A1 Jul. 31, 2008

(30) Foreign Application Priority Data
Nov. 4, 2005 (KR) .................. 10-2005-0105551

(51) Int. Cl.
*G03F 7/26* (2006.01)
(52) U.S. Cl. ..................................... 430/322

(58) Field of Classification Search ............... 430/323, 430/396, 397, 322
See application file for complete search history.

(56) References Cited

U.S. PATENT DOCUMENTS

| | | | |
|---|---|---|---|
| 4,912,022 A | 3/1990 | Urquhart et al. | |
| 5,367,359 A | 11/1994 | Takanashi et al. | |
| 5,414,490 A * | 5/1995 | Kurokawa et al. | 355/71 |
| 5,728,509 A | 3/1998 | Eda et al. | |
| 6,544,698 B1 * | 4/2003 | Fries | 430/22 |
| 2002/0003918 A1 * | 1/2002 | Ooi et al. | 385/14 |
| 2002/0042025 A1 | 4/2002 | Tokai et al. | |
| 2005/0068599 A1 | 3/2005 | Mushika | |

FOREIGN PATENT DOCUMENTS

| | | |
|---|---|---|
| JP | 53136968 | 11/1978 |
| JP | 58-114430 | * 7/1983 |

* cited by examiner

*Primary Examiner* — Kathleen Duda
*Assistant Examiner* — Caleen O Sullivan
(74) *Attorney, Agent, or Firm* — The Belles Group, P.C.

(57) ABSTRACT

A method of fabricating a polymer or resist pattern over a substrate includes coating a photosensitive polymer or resist over the substrate to form a polymer or resist layer, determining a portion of the polymer or resist layer to be exposed to light, placing a light adjusting layer in an optical path of light shone on the polymer or resist layer, and adjusting the light adjusting layer to adjust a direction or intensity of the light shone on the polymer or resist layer. Based on the method, it is easy to fabricate a polymer or resist pattern, a metal film pattern, metal pattern structure, and a polymer mold, each having three-dimensional structures with various slopes or shapes by adjusting a direction or intensity of incident light when performing a lithography process.

26 Claims, 10 Drawing Sheets

【Figure 1】
(RELATED ART)
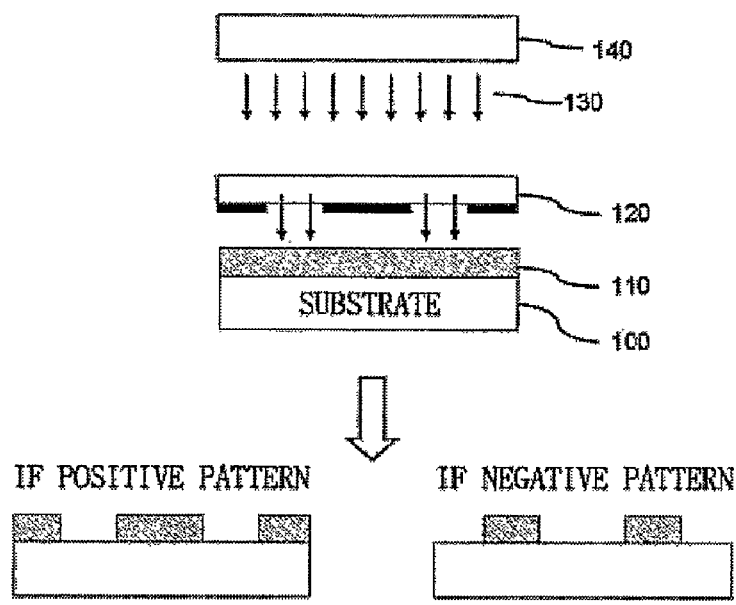
【Figure 2】
(RELATED ART)
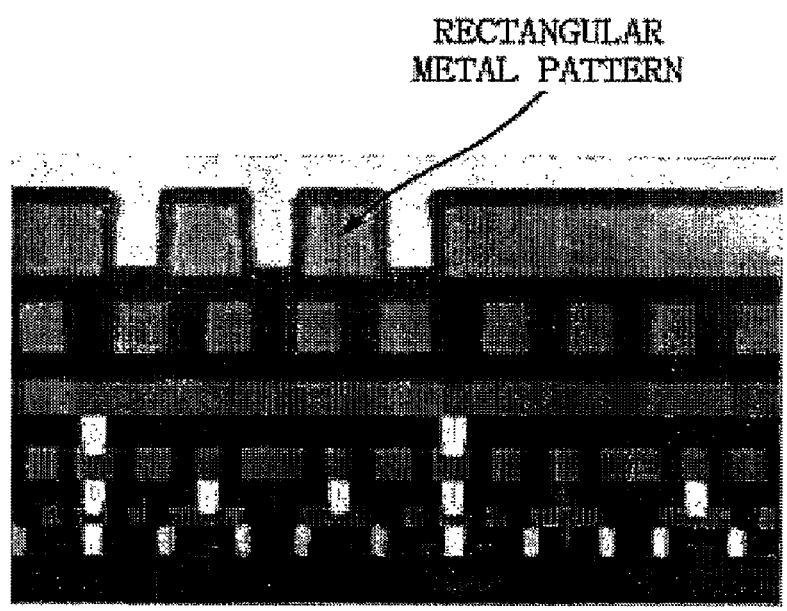

【Figure 3】
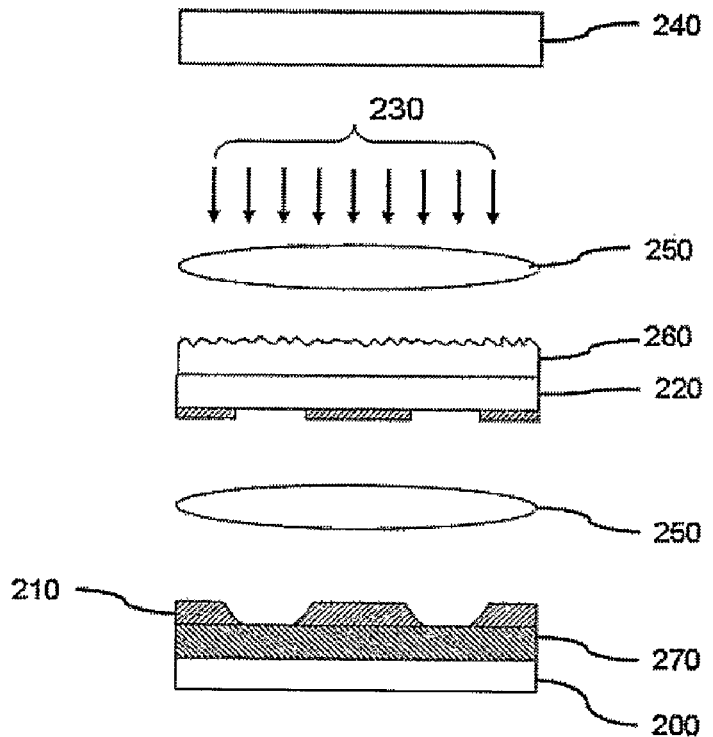
【Figure 4】
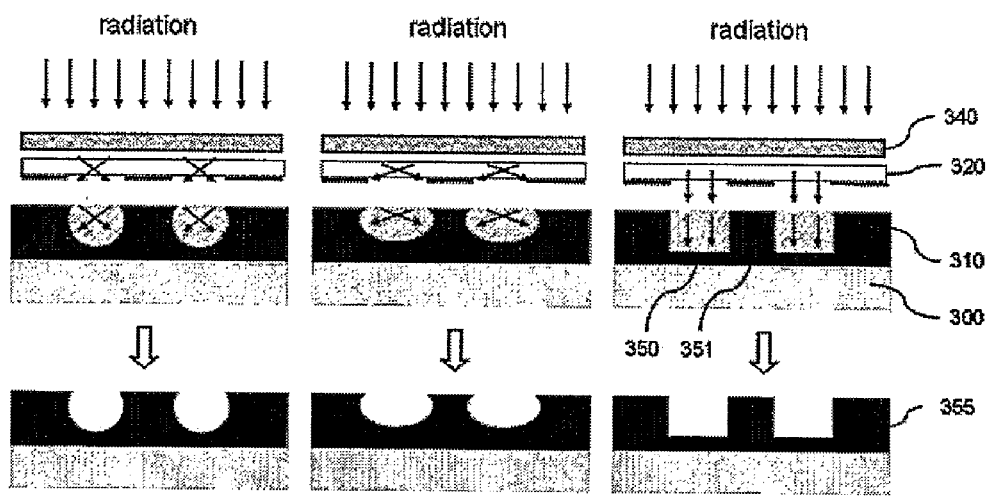

[Figure 5]
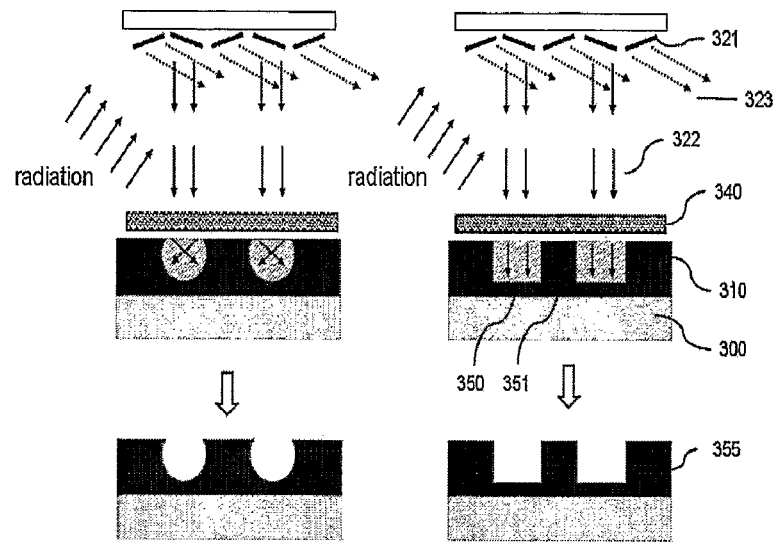
[Figure 6]
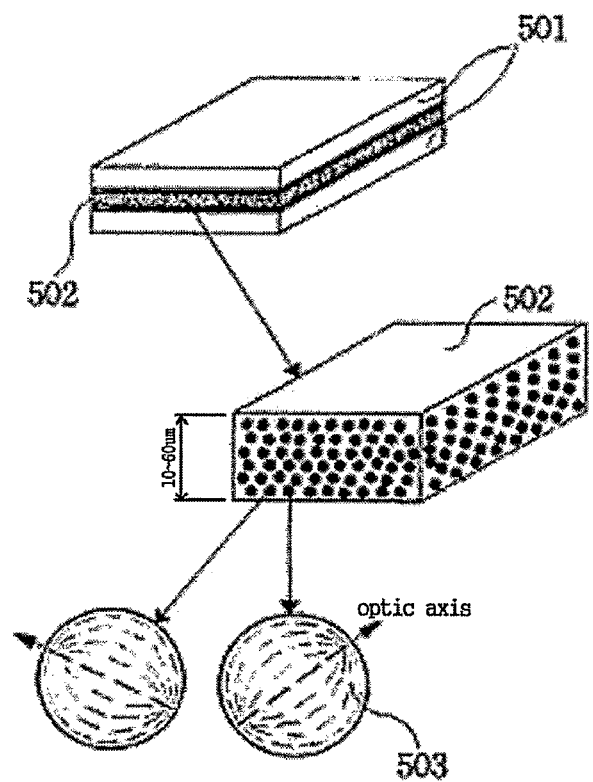

[Figure 7]
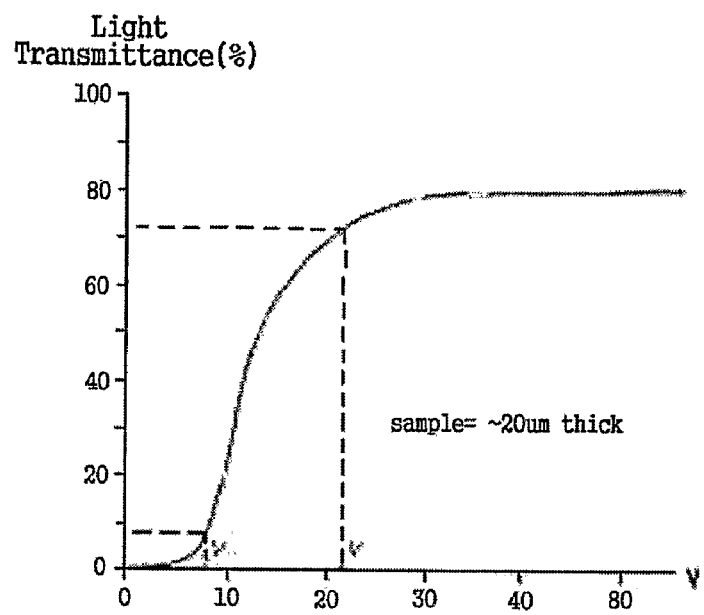
[Figure 8]
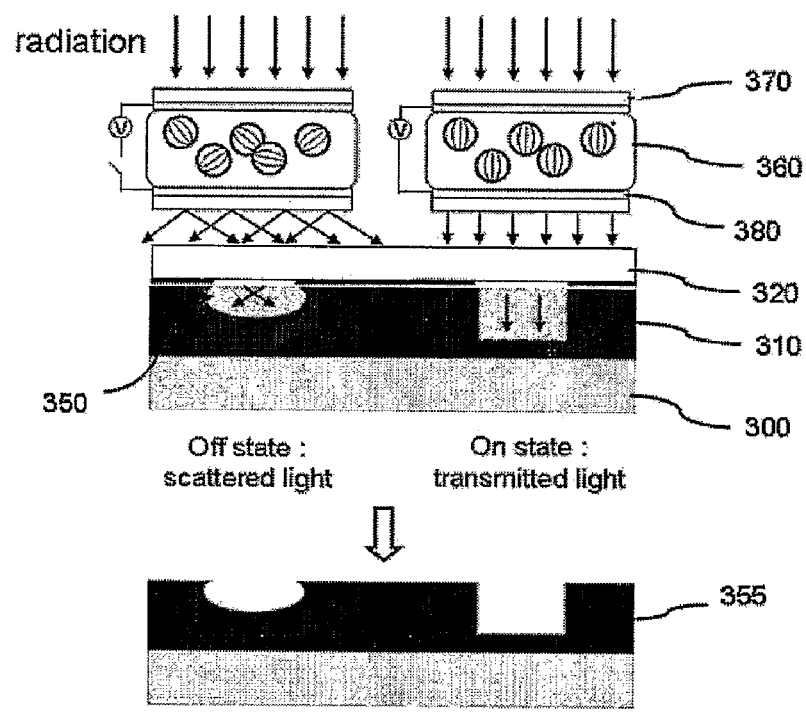

[Figure 9]
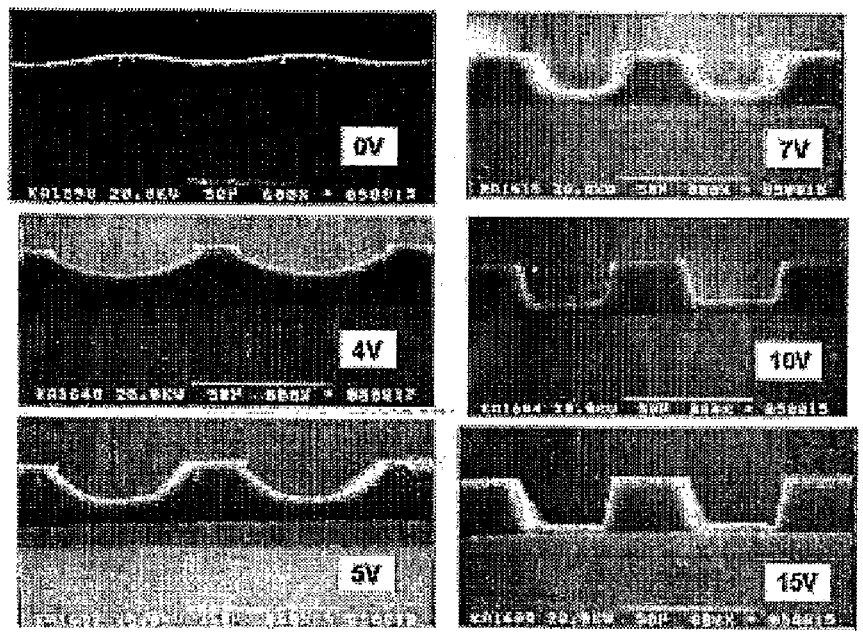
* PHOTO-EXPOSURE TIME (40 SEC)
[Figure 10]
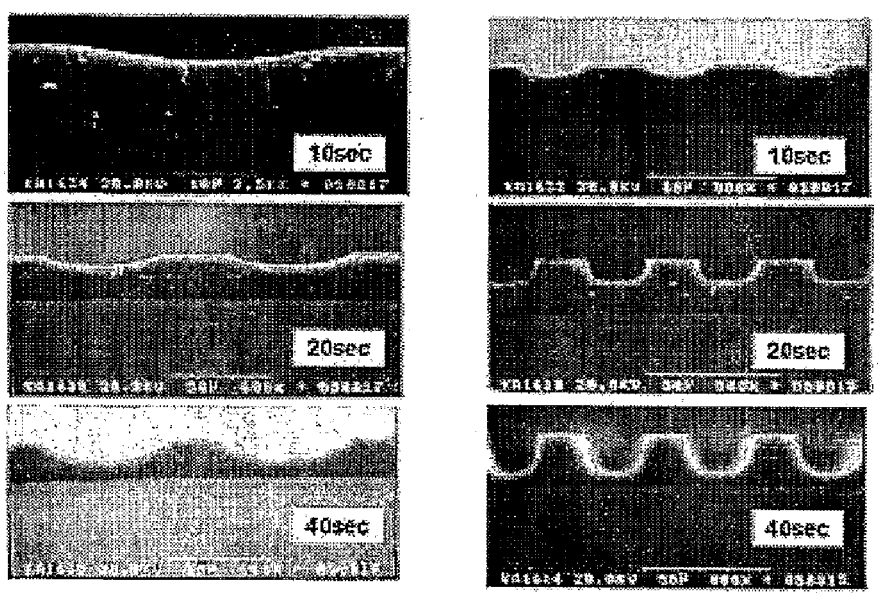
* APPLIED VOLTAGE : 4V            * APPLIED VOLTAGE : 7V 【Figure 11】
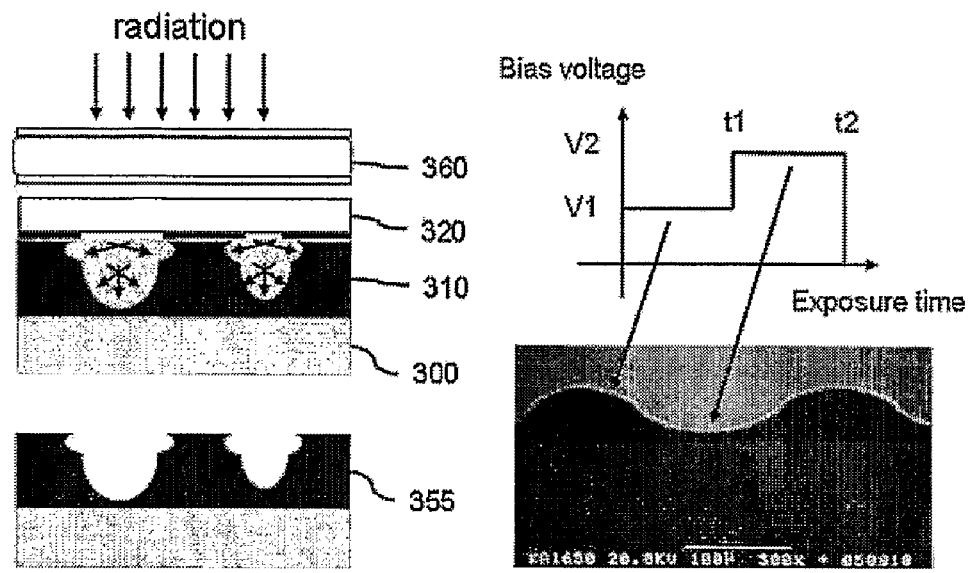
【Figure 12】
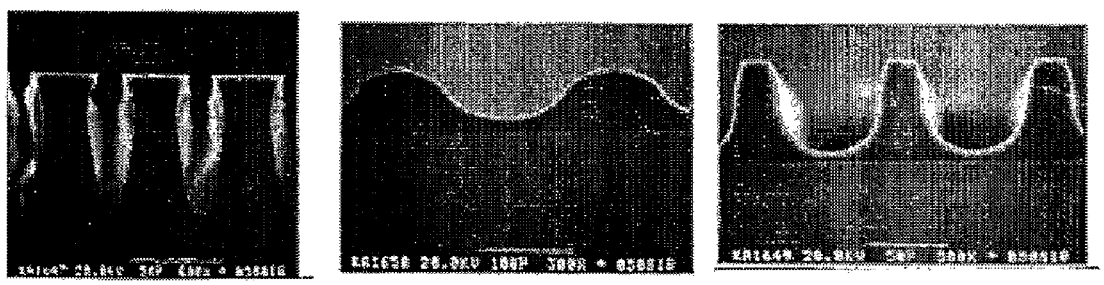

[Figure 13]
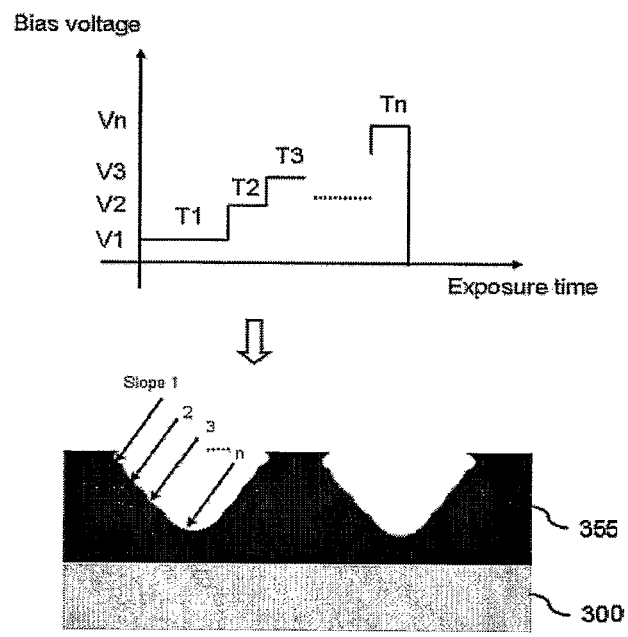
[Figure 14]
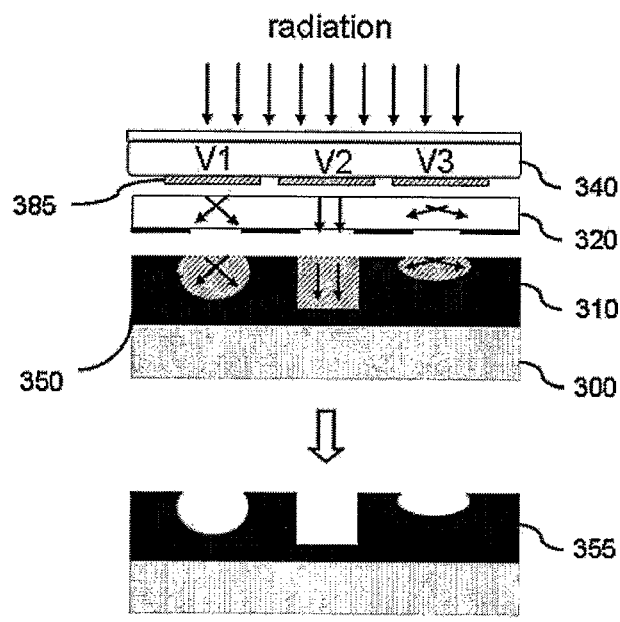

[Figure 15]
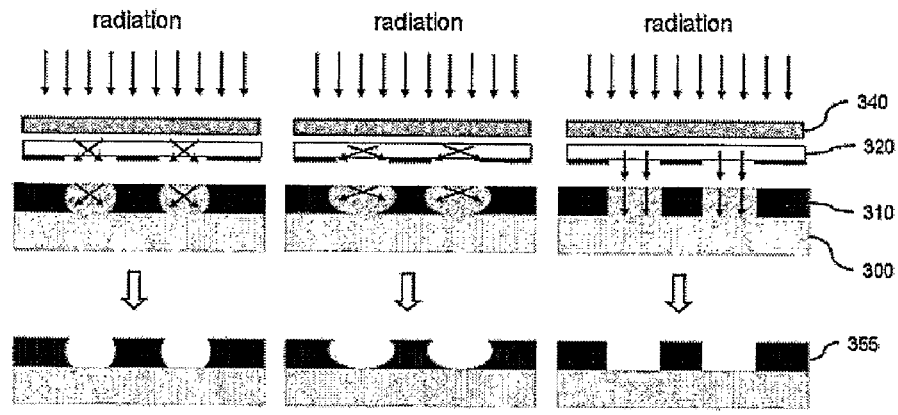
[Figure 16]
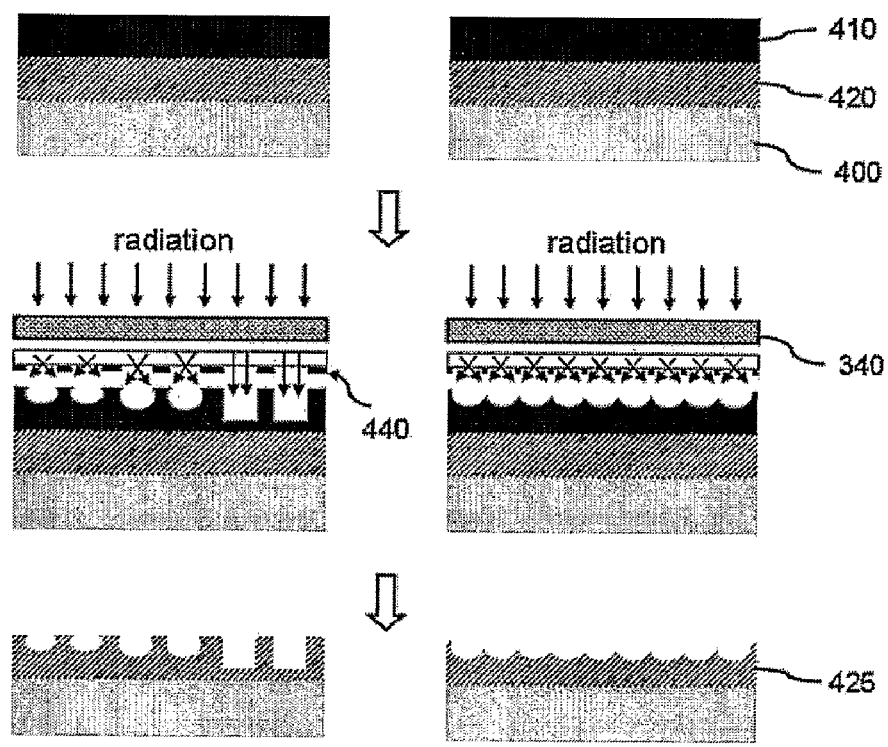

[Figure 17]
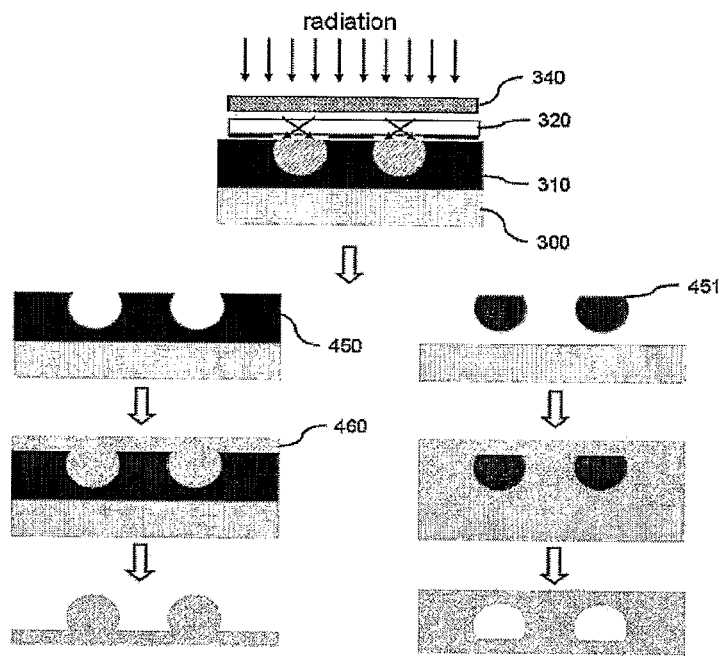
[Figure 18]
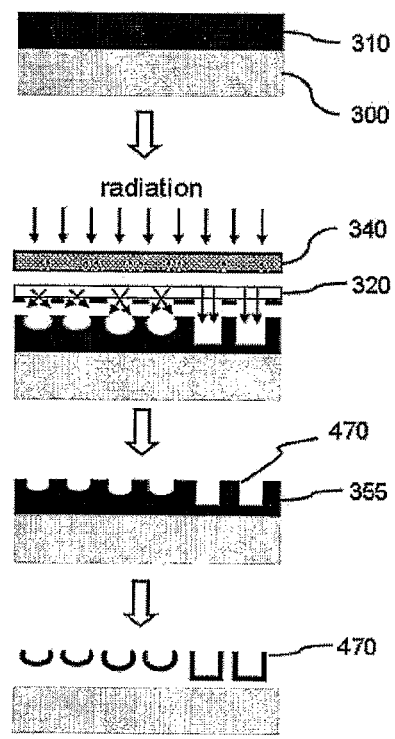

[Figure 19]
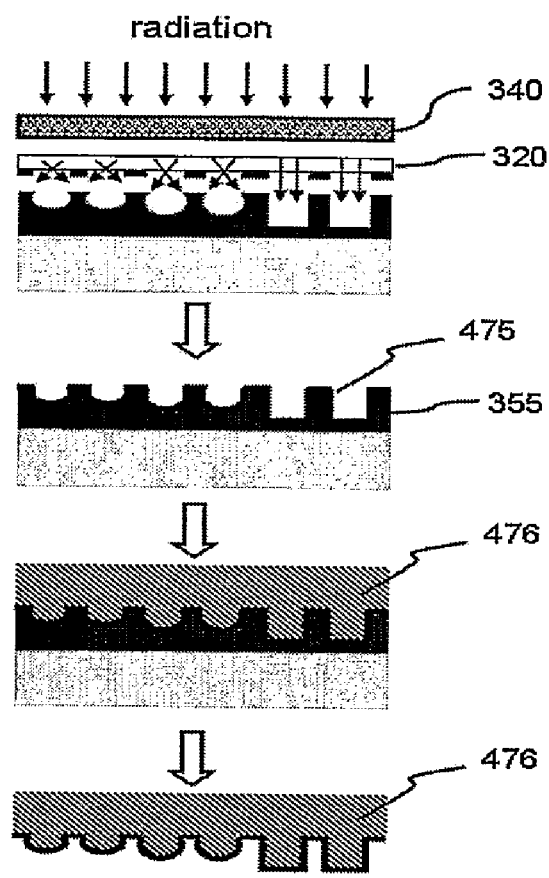

POLYMER OR RESIST PATTERN, AND METAL FILM PATTERN, METAL PATTERN AND PLASTIC MOLD USING THE SAME, AND FABRICATION METHODS THEREOF

TECHNICAL FIELD

The present invention relates to a polymer or resist pattern, and a metal film pattern, a metal pattern and a plastic mold using the polymer or resist pattern, and fabrication methods thereof, and more particularly, to a polymer or resist pattern that can be formed in various slopes and shapes by adjusting a direction or intensity of incident light when performing a lithography process, and a metal film pattern, a metal pattern and a polymer mold using the polymer or resist pattern, and fabrication methods thereof.

BACKGROUND ART

Generally, a polymer pattern is formed in a certain shape to form metal lines in circuits of semiconductor devices. The polymer pattern is formed using a photolithography process including coating a photosensitive material, exposing the photosensitive material to light and developing the photosensitive material exposed to the light.

FIG. 1 illustrates cross-sectional views to describe a method of fabricating a photosensitive polymer or resist pattern using a conventional lithography process.

Photoresist, which is a polymer, is coated on a substrate 100 to form a photoresist layer 110. A photomask 120 is disposed above the photoresist layer 110, and light 130 is shone on the substrate 100 on which the photoresist layer 110 is formed. This process is called a photo-exposure process. Afterwards, a developing process is performed on the photoresist layer 110 exposed to the light 130, so that portions of the photoresist layer 110 sensitive to the light 130 are removed, thereby forming a polymer pattern.

In conventional lithography applied to semiconductor devices, a photosensitive polymer or resist layer formed on a substrate is exposed to ultraviolet (UV) light or other forms of light that passes through a photomask patterned in a geometrical figure. Afterwards, photo-exposed portions of the photosensitive polymer or resist layer are developed to form an intended pattern. If a positive resist layer is used, the photo-exposed portions of the positive resist layer are removed by being dissolved by a developing solution. As a result, an intended pattern is formed. If a negative resist layer is used, an intended pattern is formed as a developing solution dissolves away portions of the resist layer that are not photo-exposed.

FIG. 2 illustrates a cross-sectional view of a photosensitive polymer or resist pattern and a metal pattern formed based on the conventional lithography.

As taught by S. Wolf and R. N. Tauber in an article entitled "Silicon Processing for the VLSI Era—Process Technology, Vol. 1", Lattice Press, p. 408, 1986, the cross-sectioned photosensitive polymer or resist pattern has a rectangular vertical structure since light is shone vertically to a substrate during a photo-exposure process of casting light upon the substrate.

Since metal films or layers that are formed in highly integrated circuits using a polymer pattern of which sectioned portion has a rectangular structure are also formed over the polymer pattern, the metal films or layers are also patterned in a rectangular structure from a cross-sectional view. This teaching is described in an article by R. C. Jaeger, entitled "Introduction to Microelectronic Fabrication," Prentice Hall, p. 167, 2002.

However, using merely the rectangular polymer pattern or metal pattern cannot meet complicated and numerous conditions of various semiconductor processes and intensive demands to form three-dimensional structures. As numerous semiconductor technologies have been developed, they need to be applied in various fields. Thus, it is increasingly required to develop a method of fabricating a polymer pattern or metal layer with a curved surface such as a microlens, a microswitch having a metal film with a curved surface, or a microfluidic channel.

As one approach to overcome limitations associated with using the rectangular polymer pattern or metal pattern, a lithography method for forming a sloped pattern in resist is introduced in U.S. Pat. No. 4,912,022, issued to Andy Urguhart, Kam-Shui Chan and Gregory D. Anderson in the name of "Method for Sloping the Profile of an Opening in Resist" in 1990.

In more detail of the U.S. Pat. No. 4,912,022 with reference to FIG. 3, a scattering element 260, e.g., a ground glass diffuser, causing light 230 originated from an illumination source 240 to scatter in an optical path of irradiation is placed in a conventional lithography apparatus. Due to the scattering element 260, a resist pattern 210 is formed to have a sloped profile. Depending on types of the scattering elements 260, i.e., the diffuser, a degree of light scattering can be changed. Thus, the resist pattern 210 can have various sloped profiles using various types of diffusers. Reference numerals 250 and 220 represent a lens and a photomask, respectively.

However, the above lithography method of fabricating the sloped pattern using the diffuser may be applied limitedly to form various curvature patterns since a degree of light scattering is usually fixed only by the diffuser. To change the slope of patterns variously using this lithography method, a plurality of diffusers having different scattering characteristics are needed. Therefore, using only the commonly prepared diffuser makes it difficult to form patterns with various slopes and desired shapes unrestrictedly. In one exposure application of the lithography method, a degree of light scattering that is determined by the diffuser is usually applied identically to the entire region. Hence, the entire resist pattern generally has the same sloped profile. Accordingly, it may be difficult to form the pattern with various shapes or slopes by a single exposure application of the lithography method.

DISCLOSURE OF INVENTION

Technical Problem

Therefore, one embodiment of the present invention is directed to provide a polymer or resist pattern that can be formed with various slopes and shapes by adjusting entirely or partially a direction or intensity of incident light exposed to a polymer or resist during a photolithography process, and a fabrication method thereof.

Another embodiment of the present invention is directed to provide a metal film pattern formed using the polymer or resist pattern that can be formed in various slopes and shapes, and a fabrication method thereof.

Still another embodiment of the present invention is directed to provide a metal pattern formed using the polymer or resist pattern that can be formed in various slopes and shapes, and a fabrication method thereof.

A further another embodiment of the present invention is directed to provide a polymer mold formed using the polymer or resist pattern that can be formed in various slopes and shapes, and a fabrication method thereof.

Technical Solution

According to an embodiment of the present invention, a method of fabricating a polymer or resist pattern, the method comprises coating a photosensitive polymer or resist over the substrate to form a polymer or resist layer, placing a photomask above the polymer or resist layer to determine a portion of the polymer or resist layer to be exposed to light, placing a light adjusting layer in an optical radiation path of light shone on the polymer or resist layer, and adjusting the light adjusting layer to adjust a direction or intensity of the light shone on the polymer or resist layer.

Consistent with the embodiment of the present invention, as for the placing of the photomask to determine the portion of the polymer or resist layer to be exposed to the light, instead of placing the photomask, an embedded mask may be formed on the polymer or resist layer. Alternatively, micromirror array may be operated to determine the portion to be exposed to the light.

Also, the light adjusting layer may be placed above or underneath the photomask.

Depending on the need, a direction or an intensity of light through the light adjusting layer may be adjusted sequentially or differently for each portion. As a result, the polymer or resist pattern can be formed in various shapes and slopes.

Particularly, the light adjusting layer may comprise a polymer dispersed liquid crystal layer. The direction or intensity of the light passing through the polymer dispersed liquid crystal layer may be adjusted by adjusting a direct current (DC) voltage applied to both ends of the polymer dispersed liquid crystal layer or a time of applying the voltage. Adjusting the magnitude of alternating current (AC) voltages respectively applied in forward and backward directions to the polymer dispersed liquid crystal layer, a time of applying the AC voltages respectively in forward and backward directions or a period thereof may provide substantially the same effect as the case of using the DC voltage. Forming a patterned electrode over both sides or one surface side of the polymer dispersed liquid crystal layer may allow adjusting the direction of the light or the light transmittance differently for each portion. The patterned electrode may be driven according to a passive matrix type or an active matrix type.

The direction of the light passing through the polymer dispersed liquid crystal layer is determined by adjusting the scattering or transmission rate of the polymer dispersed liquid crystal layer.

Additionally, the method may further comprise forming a target layer over the substrate to transfer a certain pattern prior to coating the photosensitive polymer or resist over the substrate, and etching the polymer or resist layer and the target layer after adjusting the light adjusting layer and forming a polymer or resist pattern. These additional operations allow transferring of a photoresist polymer or resist pattern forming various shapes and slopes to a target material.

Furthermore, a bottom of the photosensitive polymer or resist layer is exposed to the light. As a result, the polymer or resist pattern may be formed to have various slopes.

According to the method described above, it is possible to fabricate a polymer or resist pattern that has at least one slope or shape in a vertical or horizontal direction to the substrate.

According to another embodiment of the present invention, a method of fabricating a metal film pattern over a substrate comprises coating a photosensitive polymer or resist over the substrate to form a polymer or resist layer, placing a photomask above the polymer or resist layer to determine a portion of the polymer or resist layer to be exposed to light, placing a light adjusting layer in an optical path of light shone on the polymer or resist layer, adjusting the light adjusting layer to adjust a direction or intensity of the light shone on the polymer or resist layer, developing the polymer or resist layer to form a polymer or resist pattern, forming a metal thin film over the polymer or resist pattern, and removing the polymer or resist pattern.

Consistent with the other embodiment of the present invention, the forming of the metal thin film may comprise using a thin film deposition method including sputtering, or a thick film formation method including plating.

As for the placing of the photomask to determine the portion of the polymer or resist layer to be exposed to the light, instead of placing the photomask, an embedded mask may be formed on the polymer or resist layer. Alternatively, micromirror array may be operated to determine the portion to be exposed to the light.

On the basis of the method of fabricating the metal film pattern, a metal film pattern, which may have at least one curvature and slope in the vertical direction, can be formed.

According to still another embodiment of the present invention, a method of fabricating a polymer mold comprises coating a photosensitive polymer or resist over the substrate to form a polymer or resist layer, placing a photomask above the polymer or resist layer to determine a portion of the polymer or resist layer to be exposed to light, placing a light adjusting layer in an optical path of light shone on the polymer or resist layer, adjusting the light adjusting layer to adjust a direction or intensity of the light shone on the polymer or resist layer, developing the polymer or resist layer to form a polymer or resist pattern, coating a polymer over the polymer or resist pattern and hardening the polymer, and separating the hardened polymer from the polymer or resist pattern.

Consistent with still the other embodiment of the present invention, the coating the polymer over the polymer or resist pattern and the separating the hardened polymer from the polymer or resist pattern may comprise using a plastic-based material as the polymer.

Instead of placing the photomask, an embedded mask may be formed on the polymer or resist layer. Alternatively, micromirror array may be operated to determine the portion to be exposed to the light.

According to the method of fabricating the polymer mold, a polymer mold structure, which may have at least one slope and shape in a vertical or horizontal direction, can be formed. The polymer mold may be formed to have an empty space inside. The empty space may have a polymer mold structure implemented as a microfluidic channel used as a fluid path in the micro-scale. Also, a microlens structure may be formed using a protruding portion with a curved surface of the polymer mold.

According to a further aspect of the present invention, a method of fabricating a metal pattern comprises coating a photosensitive polymer or resist over the substrate to form a polymer or resist layer, placing a photomask above the polymer or resist layer to determine a portion of the polymer or resist layer to be exposed to light, placing a light adjusting layer in an optical path of light shone on the polymer or resist layer, adjusting the light adjusting layer to adjust a direction or intensity of the light shone on the polymer or resist layer, developing the polymer or resist layer to form a polymer or resist pattern, forming a metal thin film over the polymer or resist pattern, forming a metal pattern over the metal thin film using a plating method, and separating the metal pattern from the polymer or resist pattern.

Instead of placing the photomask, an embedded mask may be formed on the polymer or resist layer. Alternatively, micromirror array may be operated to determine the portion to be exposed to the light.

According to the method of fabricating the metal pattern, a metal pattern, which may have at least one slope and shape in a vertical or horizontal direction, can be formed.

Advantageous Effects

According to various embodiments of the present invention, a three-dimensional polymer or resist pattern with various slopes or shapes can be fabricated through simple lithography modified from the conventional elements or methods used in the conventional lithography.

For the fabrication of a polymer or resist pattern based on the embodiment of the present invention, the polymer or resist patterns with various slopes or shapes ranging from rectangles to curves can be formed by adjusting the scattering and transmission rate of light or a direction of incident light through a light adjusting layer that are usually necessary for reacting to a polymer or resist during a photo-exposure process of lithography. Since the scattering and transmission rate of light or the direction of the incident light can be changed variously while the polymer or resist is exposed to the light, various curved figures or sloped profiles can be formed within a single pattern. The scattering and transmission rate of light or the direction of the incident light through a light adjusting layer can be adjusted differently for each section of the light adjusting layer. Thus, it is possible to form a polymer or resist pattern having more than one shape or slope in a horizontal or vertical direction. These polymer or resist patterns can be easily transferred to other layers using various methods such as plastic molding and etching. These methods can be implemented to form spherical or aspherical microlenses with ease. Additionally, various and complex pattern structures can also be formed using these methods.

A polymer mold structure that is more complex and diverse can be formed using the polymer or resist pattern fabricated according to the exemplary embodiment of the present invention. Thus, fabrication costs can be reduced. Therefore, the polymer mold and the fabrication method thereof can be applied in wide industrial fields as compared with a conventional microfluidic apparatus.

When a metal layer is formed using the polymer or resist pattern fabricated according to the exemplary embodiments of the present invention, the metal layer or metal pattern structures can be formed in various shapes which often cannot be formed through the conventional semiconductor technology.

Accordingly, as shown above, patterns with various shapes and structures that cannot be fabricated using the conventional semiconductor technology and lithography can be easily fabricated. The polymer or resist pattern and other patterns fabricated using the same, and fabrication methods thereof can be widely applied in fabricating a microlens, a metal layer, a plastic mold, and a concave-convex structure. Various other implementations of the above mentioned patterns and fabrication methods thereof are also possible.

BRIEF DESCRIPTION OF THE DRAWINGS

The above text and features of the present invention will become better understood with respect to the following description of the exemplary embodiments given in conjunction with the accompanying drawings, in which:

FIG. 1 illustrates cross-sectional views to describe a method of fabricating a positive photosensitive polymer pattern using a conventional lithography process;

FIG. 2 illustrates a cross-sectional view of a metal pattern formed using the polymer pattern obtained based on the conventional lithography process;

FIG. 3 depicts a diagram to illustrate a method of fabricating a conventional resist pattern with a sloped profile;

FIG. 4 depicts diagrams to illustrate a method of fabricating a polymer or resist pattern according to an embodiment of the present invention;

FIG. 5 depicts diagrams to illustrate a method of fabricating a polymer or resist pattern according to another embodiment of the present invention;

FIG. 6 illustrates a diagram to describe a polymer dispersed liquid crystal layer according to an embodiment of the present invention;

FIG. 7 is a graph illustrating transmittance of a polymer dispersed liquid crystal layer according to an embodiment of the present invention;

FIG. 8 illustrates a diagram to describe a method of fabricating a polymer or resist pattern using a polymer dispersed liquid crystal layer according to an embodiment of the present invention;

FIG. 9 illustrates scanning electron microscope (SEM) micrographs of pattern shapes changing according to the magnitude of a voltage applied to the polymer dispersed liquid crystal layer illustrated in FIG. 8;

FIG. 10 illustrates scanning electron microscope (SEM) micrographs of pattern shapes changing according to a photo-exposure time per magnitude of a voltage applied to the polymer dispersed liquid crystal layer illustrated in FIG. 8;

FIG. 11 is a diagram illustrating pattern shapes when a voltage applied to the polymer dispersed liquid crystal layer illustrated in FIG. 8 is changed twice;

FIG. 12 illustrates scanning electron microscope (SEM) micrographs of resist patterns with various shapes formed based on the method illustrated in FIG. 11;

FIG. 13 is a diagram illustrating pattern shapes when a voltage that is applied to the polymer dispersed liquid crystal layer illustrated in FIG. 8 is sequentially changed;

FIG. 14 is a diagram to illustrate a method of fabricating patterns in various shapes with applying a lithography process once by adjusting individually a scattering and transmission rate for each portion of a polymer dispersed liquid crystal layer according to an embodiment of the present invention;

FIG. 15 illustrates diagrams to describe a method of adjusting a slope of a polymer or resist pattern using the exemplary method of fabricating the polymer or resist pattern according to an embodiment of the present invention;

FIG. 16 illustrates diagrams to describe a method of transferring a pattern on a target element using the exemplary method of fabricating the polymer or resist pattern according to an embodiment of the present invention;

FIG. 17 illustrates diagrams to describe a method of fabricating a polymer (e.g., plastic) mold using the exemplary method of fabricating the polymer or resist pattern according to an embodiment of the present invention;

FIG. 18 illustrates diagrams to describe a method of fabricating a metal film pattern using the exemplary method of fabricating the polymer or resist pattern according to an embodiment of the present invention; and FIG. 19 illustrates diagrams to describe a method of fabricating a metal pattern using the exemplary method of fabricating the polymer or resist pattern according to an embodiment of the present invention.

BEST MODE FOR CARRYING OUT THE INVENTION

Various embodiments of the present invention will be described in detail with reference to the accompanying drawings.

Herein, like reference numerals denote like elements even in different drawings.

FIG. 4 depicts diagrams to illustrate a method of fabricating a polymer or resist pattern according to an embodiment of the present invention.

A polymer or resist material is coated over a substrate 300 to form a photosensitive polymer or resist layer 310. A photomask 320 is disposed above the polymer or resist layer 310, or an embedded mask is formed on the surface of the polymer or resist layer 310. A light adjusting layer 340 that can selectively adjust a direction or transmittance of incident light is placed in an optical projection path for a photo-exposure process. For instance, the light adjusting layer 340 may be placed underneath or above the photomask 320. The light adjusting layer 340 is adjusted to adjust a direction or transmittance of incident light. Then, the incident light passing through the light adjusting layer 340 is exposed onto the polymer or resist layer 310 to form patterns with various shapes and slopes. As illustrated, by the direction of incident light or the light intensity due to the transmittance of the light adjusting layer, the polymer or resist layer 310 is patterned to a circular or quadrangular shape when being cross-sectioned.

The photomask 320 may be obtained by coating and patterning a thin film of chrome on a transparent quartz substrate generally used in the conventional lithography. Alternatively, the photomask 320 may be an embedded mask obtained by depositing a metal layer directly on a polymer or resist layer and patterning the metal layer. The photosensitive polymer or resist layer 310 disposed underneath the photomask 320 is divided into a portion 350 that is exposed to light passing through the photomask 320 and another portion 351 that is not exposed to the light. If the photosensitive polymer or resist layer 310 is a positive type, immersing the polymer or resist layer 310 in a developing solution after the photo-exposure causes the other portion 351 of the polymer or resist layer 310 to remain. On the contrary, if the polymer or resist layer 310 is a negative type, the portion 350 of the polymer or resist layer 310 remains when being immersed in a developing solution.

In the method of fabricating the polymer or resist pattern according to the present embodiment, the light adjusting layer 340 is placed in the optical radiation path of the conventional lithography for exposing the photosensitive polymer or resist layer to light. The light adjusting layer 340 is used to adjust a direction or intensity of the light exposed to the polymer or resist layer 310 nearly identically throughout the entire region or differently for each portion. As a result, the photosensitive polymer or resist layer 310 is patterned to a polymer or resist pattern 355 with various slopes or shapes.

FIG. 5 depicts diagrams to illustrate a method of fabricating a polymer or resist pattern according to another embodiment of the present invention.

In a maskless lithography process, depending on an operational angle of a micromirror array 321, light is adjusted to light 322 incident over a polymer or resist layer and light 323 not incident thereover. The selective operation of the micromirror array 321 allows selecting a portion to be exposed to light or a portion not to be exposed to light. Thus, a mask is not necessary for the lithography process. In the maskless lithography process that uses the micromirror array 321 to select a portion to be exposed to light or a portion not to be exposed to light instead of the photomask or embedded mask, a light adjusting layer 340 is disposed in an optical radiation path to adjust a direction or intensity of incident light. As a result, a polymer or resist layer 310 is patterned to form a polymer or resist pattern 355 having various slopes and shapes.

FIGS. 6 and 7 illustrate diagrams to describe a polymer dispersed liquid crystal layer according to an embodiment of the present invention. The polymer dispersed liquid crystal layer is one example of the light adjusting layer 340 illustrated in FIG. 4.

The polymer dispersed liquid crystal layer 502 is placed between two glass substrates 501, each including a transparent conductive layer formed over one surface thereof.

The polymer dispersed liquid crystal layer 502 consists of polymer dispersed liquid crystal microdroplets 503 in a polymer network between two glass sheets. The polymer dispersed liquid crystal layer 502 determines light transmittances and angles of incidence depending on the scattering and transmission rate of incident light of the polymer dispersed liquid crystal microdroplets 503 included within the polymer dispersed liquid crystal layer 502. Different from nematic liquid crystals, the polymer dispersed liquid crystals 503 do not need a polarizing plate. There exist various polymer dispersed liquid crystal structures including numerous liquid crystal molecules dispersed within a polymer network or liquid crystals within a net-shaped polymer network. If a voltage is not applied to both ends of the transparent conductive layer, the polymer dispersed liquid crystals 503 of the polymer dispersed liquid crystal layer 502 are oriented randomly and the difference of a refractive index between microdroplets and a polymer medium stimulates a scattering event on the interfaces. As a result, incident light is scattered by the polymer dispersed liquid crystal microdroplets. This is a highly scattering state in an off bias.

However, when a voltage is applied to both ends of the transparent conductive layer, the polymer dispersed liquid crystals 503 are oriented in the direction of an electric field and light is completely transmitted without any scattering. Therefore, by changing the scattering and transmission states of the polymer dispersed liquid crystal layer due to its bias voltage. The above explained behavior of the polymer dispersed liquid crystals 503 is taught by G. Spruce and R. D. Pringle in an article from Electronics & Communication Engineering Journal, pp. 91-100, 1992.

FIG. 7 illustrates a graph of light transmittance measured in percents (%) depending on the magnitude of a voltage (V) applied to conductive layers of polymer dispersed liquid crystal film according to an embodiment of the present invention. As described by G. Spruce and R. D. Pringle in the same article above, the greater the magnitude of the applied voltage, the higher the light transmittance of a polymer dispersed liquid crystal layer. As a result, the light intensity exposed to the polymer or resist layer through the polymer dispersed liquid crystal layer is affected by the transmittance of the polymer dispersed liquid crystal layer in an embodiment of the present invention.

FIG. 8 illustrates a diagram to describe a method of fabricating a polymer or resist pattern using a polymer dispersed liquid crystal layer according to an embodiment of the present invention. The polymer dispersed liquid crystal layer is used as one example of the light adjusting layer 340 illustrated in FIG. 4.

The polymer dispersed liquid crystal layer 360 is disposed between two glass substrates 370 each including a transparent conductive layer 380 formed over one surface thereof. Disposing the polymer dispersed liquid crystal layer 360 over a photomask 320 is more convenient in using a conventional lithography apparatus.

Adjusting and combining the magnitude of a voltage applied to both sides of the polymer dispersed liquid crystal layer 360 and the time of applying the voltage allows consecutively adjusting the light scattering and transmission rates of the polymer dispersed liquid crystal layer 360. As a result, the direction and intensity of the light passing through the polymer dispersed liquid crystal film 390 is determined depending on the scattering characteristics of the polymer dispersed liquid crystal layer. Therefore, an intensity and direction of light exposed onto a photosensitive polymer or resist to determine a shape of the exposed region of the polymer or resist is controlled by the voltage applied to the both sides of the polymer dispersed liquid crystal layer 360 and the time of applying the voltage. Hence, it is possible to form a polymer or resist pattern with various slopes and shapes.

The voltage applied to both sides of the polymer dispersed liquid crystal layer 360 may be a direct current (DC) voltage or an alternating current (AC) voltage. When the DC voltage is applied, the scattering and transmission characteristics of light passing through the polymer dispersed liquid crystal layer are adjusted according to the magnitude of the voltage. On the other hand, when the AC voltage is applied, the magnitude, a ratio and a period of each of the AC voltages applied in forward and backward directions are adjusted to change the magnitude of a root-mean-square (RMS) value of the AC voltage, so that the scattering and transmission characteristics of light passing through the polymer dispersed liquid crystal layer can be adjusted. Also, the transparent conductive layer 380 formed on each of the glass substrates 370 may be a common electrode that is not patterned, and can be used in a passive matrix type or an active matrix type. Instead of the glass substrate or the transparent conductive layer, the polymer dispersed liquid crystal layer 360 can be formed in various forms including a polymer substrate that can be bent or a conductive polymer-based material. The polymer dispersed liquid crystal layer 360 may be fabricated adhered to the photomask 320.

With reference to FIGS. 9 and 10, photoresist pattern shapes that change according to the magnitude of a voltage applied to the polymer dispersed liquid crystal layer 360 and the time of applying the voltage will be described herein below.

FIG. 9 illustrates scanning electron microscopy micrographs of positive photoresist patterns to describe shapes of the patterns changing according to the magnitude of a voltage applied to the polymer dispersed liquid crystal layer 360 while consistently maintaining a photo-exposure time of approximately 40 seconds.

When the voltage is applied with the magnitude of approximately 0V, 4V, 5V, 7V, 10V, and 15V while maintaining the photo-exposure time of approximately 40 seconds, the direction and intensity of light exposed to the photoresist are adjusted according to the magnitude of the applied voltage. Thus, it is possible to form patterns with various shapes including circular shapes ranging from a circle with small vertical height and large horizontal width to a circle with large vertical height and small horizontal width, and rectangular pattern shapes that can be obtained using the conventional lithography.

FIG. 10 illustrates scanning electron microscopy micrographs of positive photoresist patterns to describe shapes of the patterns changing according to the time of applying a voltage (i.e., the photo-exposure time) while the magnitude of the voltage applied to the polymer dispersed liquid crystal layer 360 is consistently maintained.

When the applied voltage levels are approximately 4V and 7V, and the time of applying the voltage changes in order of approximately 10 seconds, 20 seconds and 40 seconds, various shapes of the patterns can be obtained. That is, adjusting the magnitude of the voltage applied to the polymer dispersed liquid crystal layer 360 and the photo-exposure time allows form the pattern in various shapes.

Although the above embodiments describe about the positive photosensitive type of polymers such as photoresist pattern, variously shaped patterns that have inversed remaining and removed portions to the illustrated positive photoresist patterns can still be achieved using a negative photosensitive polymer or photoresist pattern.

With reference to FIGS. 11 to 13, pattern shapes that change when the magnitude of a voltage applied to the polymer dispersed liquid crystal layer 360 and the time of applying the voltage during a lithography process will be described hereinafter.

FIG. 11 illustrates exemplary pattern shapes changing when a voltage applied to the polymer dispersed liquid crystal layer 360 is changed, and simultaneously the voltage applying time is adjusted for each applied voltage during a single exposure application of a lithography process. FIG. 12 illustrates additional exemplary pattern shapes obtained when the magnitudes of the voltage and the voltage applying times are concurrently adjusted.

As illustrated in FIGS. 11 and 12, simultaneously adjusting the magnitudes of the voltage applied to the polymer dispersed liquid crystal layer 360 and the voltage applying times during the lithography process allows forming patterns with complex shapes with various curvatures or slopes according to the vertical direction of the patterns. More various and complex pattern shapes and structures can be formed depending on how to adjust.

FIG. 13 illustrates various pattern shapes changing when voltages applied to the polymer dispersed liquid crystal layer 360 and voltage applying times are variously changed.

During a single exposure application of a lithography process, changing the magnitudes of the voltage applied to the polymer dispersed liquid crystal layer 360 from approximately V1 to Vn, and the voltage applying times for each magnitude of the applied voltage from approximately T1 to Tn allows fabricating patterns with various sloped angles or curvatures according to the vertical direction of the patterns. Also, this fabrication method can be applied in forming aspheric lenses.

As described above, in the case of the DC voltage, patterns with various shapes can be fabricated in combination of the magnitudes of the voltage and the voltage applying times. In the case of the AC voltage, combining the magnitudes, a ratio and a period of each of the AC voltages applied in forward and backward directions can give substantially the same adjustment as the DC voltage.

With reference to FIG. 14, a method of fabricating a polymer or resist pattern using a patterned transparent conductive layer according to another embodiment of the present invention will be described.

Various pattern shapes that are different for each portion of a pattern can be obtained with a single application of a lithography process by differently adjusting the magnitude of a voltage applied differently to each portion of the patterned transparent conductive layer 385 and a time of applying the voltage. The magnitude of the voltage applied to the patterned transparent conductive layer 385 and the voltage applying time are adjusted for each portion of the patterned transparent conductive layer 385 using an addressing method. Through this sectional adjustment, a direction or intensity of light passing through a light adjusting layer 340 can be separately adjusted for each portion of the patterned conductive layer 385. Thus, each portion of the pattern is not formed in the same shape, but in different shapes for each section through performing the addressing method. The addressing method may be a passive or active addressing method for the conventional liquid crystals as known in the art. Also, it is possible to employ a passive or active addressing method that proceeds with the adjustment by using one electrode of two sided electrodes simply as a common electrode and patterning the other electrode.

FIG. 15 illustrates diagrams to describe a method of adjusting a slope of a polymer or resist pattern using the exemplary method of fabricating the polymer or resist pattern according to an embodiment of the present invention.

The above embodiments of the present invention describe exemplary lithography processes in which middle portions of the polymer or resist molds are exposed to light. However, as illustrated in FIG. 15, using a very thin polymer or resist or photo-exposing the polymer or resist down to the bottom, the polymer or resist can have various sloped patterns FIG. 16 illustrates diagrams to describe a method of transferring a pattern onto a target element using the exemplary method of fabricating the polymer or resist pattern according to an embodiment of the present invention.

A transfer layer 420 which is a target material to transfer pre-fabricated polymer or resist patterns is formed over a substrate 400, and a polymer or resist layer 410 is coated over the transfer layer 420. The polymer or resist layer 410 is patterned to a desired shape using the method of fabricating the polymer or resist pattern according to the embodiments of the present invention. Etching the entire region of the transfer layer 420 using the polymer or resist pattern layer 410 as a masking layer allows a pattern in the polymer or resist layer 410 to be transferred to the transfer layer 420. During the etching process, in the region where the polymer or resist pattern are so thin that completely removed prior to others, the 3-D profile or shape of photoresist molds is transferred into the target layer. And, the etching process is stopped after all the resist or polymer pattern molds are fully removed. Consequently, the pre-formed sloping profiles or shapes of polymer or resist pattern are transferred into the target transfer layer very simply. Examples of the etching are an ion milling process, an inductively coupled plasma process, and a reactive ion etching process. Reference numeral 425 denotes a transfer layer having substantially the same pattern as the pattern in the polymer or resist layer 140. A sloped curvature or a size of a shape on the surface can be increased or decreased by adjusting an etch ratio of the transfer layer 420 to the polymer or resist layer 410 or vice versa.

Herein below other implemented methods using the method of fabricating the polymer or resist pattern according to the exemplary embodiment of the present invention are described in detail. Particularly, fabrication methods of a polymer mold, a metal film pattern and a metal pattern will be examined. Because the method of fabricating the polymer or resist pattern according to the exemplary embodiment of the present invention is identically applied to the fabrication methods of a polymer mold, a metal film pattern and a metal pattern, the explanation of the method of fabricating the polymer or resist pattern will be omitted in the followings.

FIG. 17 illustrates diagrams to describe a method of fabricating a polymer (e.g., plastic) mold using the exemplary method of fabricating the polymer or resist pattern according to an embodiment of the present invention.

A layer of a polymer or plastic-based material is formed over polymer or resist patterns 450 and 451 fabricated in various slopes or shapes based on the above embodied method and hardened to form molds. The initially formed polymer or resist pattern molds are immersed into an etch solution to remove or peeled off to form another polymer or plastic molds transferred from the original pattern. For example, a liquid material such as polydimethylsiloxane (PDMS) is cast on the polymer or resist pattern layer and peeled off from the polymer or resist pattern layer after it is cured. This method of fabrication the polymer or plastic mold can be applied in forming stamp pattern molds for printing the pattern in several times or applied in forming microfluidic channels.

FIG. 18 illustrates diagrams to describe a method of fabricating a metal film pattern using the exemplary method of fabricating the polymer or resist pattern according to an embodiment of the present invention.

The method illustrated in FIG. 18 is a method of fabricating metal thin films with various curved figures using a polymer or resist pattern 355 having various slopes or shapes or the transferred pattern structure fabricated according to the above-described embodied method. A metal thin film 470 can be formed over the polymer or resist pattern 355 or the transferred pattern structure through performing various thin film deposition methods including sputtering. Afterwards, a polymer or resistor mold is removed using wet or dry etching to form the metal thin films with various slopes and shapes.

FIG. 19 illustrates diagrams to describe a method of fabricating a metal pattern using the exemplary method of fabricating the polymer or resist pattern according to an embodiment of the present invention.

A metal thin film 475 is formed over a polymer or resist pattern 355 formed to have various shapes or slopes using the method of fabricating the polymer or resist pattern according to the embodiment of the present invention. A metal pattern 476 is additionally formed over the polymer or resist pattern 355 using a plating method. The originally formed polymer or resist pattern mold is removed by being immersed into an etch solution or picking off the originally formed polymer or resist pattern mold. As a result, a metal pattern 476 that is transferred from the polymer or resist pattern 355 is formed. This fabrication method of the metal pattern 476 can be applied in fabricating stamp pattern mold to print patterns in several times.

Although the exemplary embodiments of the present invention are described with reference to the accompanying drawings, the present invention should not construed as being limited to the provided exemplary embodiments and the drawings, and it will be understood by those of ordinary skill in the art that various changes in form and details may be made without departing from the spirit and scope of the present invention.

The invention claimed is:

1. A method of fabricating a polymer or resist pattern over a substrate, the method comprising:
    coating a photosensitive polymer or resist over the substrate to form a polymer or resist layer;
    determining a portion of the polymer or resist layer to be exposed to light;
    placing a light adjusting layer in an optical path of light shone on the polymer or resist layer;
    adjusting the light adjusting layer to adjust a direction and transmittance of the light shone on the polymer or resist layer; and
    passing light through the light adjusting layer and exposing the light onto the polymer or resist layer such that the polymer or resist layer has a cross section having patterns with various slope angles or various shapes by adjusting the direction and transmittance of the light.

2. The method of claim 1, wherein the determining the portion of the polymer or resist layer to be exposed to the light comprises placing a photomask above the polymer or resist layer.

3. The method of claim 1, wherein the determining the portion of the polymer or resist layer to be exposed to the light comprises forming an embedded mask on the polymer or resist layer.

4. The method of claim 1, wherein the determining the portion of the polymer or resist layer to be exposed to the light comprises operating a micromirror array.

5. The method of claim 1, wherein the direction and transmittance of the light is changed.

6. The method of claim 1, wherein the direction and transmittance of the light is adjusted for each portion to be exposed to the light.

7. The method of claim 1, wherein the light adjusting layer comprises a polymer dispersed liquid crystal layer.

8. The method of claim 7, wherein the light adjusting layer is adjusted based on a direct current (DC) voltage applied to both ends of the polymer dispersed liquid crystal layer or a time of applying the voltage.

9. The method of claim 7, wherein the light adjusting layer comprises a patterned electrode over both sides or one surface side of the polymer dispersed liquid crystal layer.

10. The method of claim 7, wherein the light adjusting layer is adjusted by the magnitude of alternating current (AC) voltages respectively applied in forward and backward directions to the polymer dispersed liquid crystal layer, a time of applying the AC voltages respectively in forward and backward directions or a period thereof.

11. The method of claim 7, wherein the direction and transmittance of the light are adjusted by changing a voltage applied to the polymer dispersed liquid crystal layer or a voltage applying time during the exposure to the light.

12. The method of claim 7, wherein the patterned electrode formed over the both edge portions of the polymer dispersed liquid crystal layer have at least one patterned portion and drives according to a passive matrix type or an active matrix type.

13. The method of claim 1, wherein the direction of the light is determined by adjusting light scattering or transmission rate of the light adjusting layer.

14. The method of claim 1, further comprising:
prior to coating the photosensitive polymer or resist over the substrate, forming a transfer layer over the substrate to transfer a certain pattern; and
etching a pattern formed after adjusting the light adjusting layer.

15. The method of claim 1, wherein a bottom of the photosensitive polymer or resist layer is exposed to the light.

16. A polymer or resist pattern fabricated according to the method of fabricating the polymer or resist pattern claimed in claim 1 and having at least one slope angle or shape in a vertical direction to the substrate.

17. A polymer or resist pattern fabricated according to the method of fabricating the polymer or resist pattern claimed in claim 1 and having at least one slope angle or shape in each of vertical or horizontal directions to the substrate.

18. The method of claim 1 wherein the cross section has patterns with various slope angles that have a plurality of different non-zero slope angles.

19. The method of claim 1 wherein the direction and transmittance of the light are adjusted by applying a first voltage to the light adjusting layer for a first time period and applying a second voltage to the light adjusting layer for a second time period, and wherein during the first time period a first pattern is fabricated in the polymer or resist layer and during the second time period a second pattern is fabricated in the polymer or resist layer, the first pattern being different from the second pattern, and at least one of the first and second patterns having a plurality of different non-zero slope angles.

20. A method of fabricating a polymer or resist pattern over a substrate, the method comprising:
coating a photosensitive polymer or resist over the substrate to form a polymer or resist layer;
placing a light adjusting layer in an optical path of light shone on the polymer or resist layer;
adjusting the light adjusting layer to adjust a direction and transmittance of the light shone on the polymer or resist layer; and
passing light through the light adjusting layer and exposing the light onto the polymer or resist layer such that the polymer or resist layer has a cross section having patterns with a plurality of different non-zero slope angles by adjusting the direction and transmittance of the light.

21. The method of claim 20, wherein the light adjusting layer comprises a polymer dispersed liquid crystal layer.

22. The method of claim 20 further comprising placing a photomask above the polymer or resist layer.

23. A method of fabricating a polymer or resist pattern over a substrate, the method comprising:
coating a photosensitive polymer or resist over the substrate to form a polymer or resist layer;
placing a light adjusting layer in an optical path of light shone on the polymer or resist layer;
adjusting the light adjusting layer to adjust a direction and transmittance of the light shone on the polymer or resist layer; and
passing light through the light adjusting layer and exposing the light onto the polymer or resist layer,
wherein the direction or transmittance of the light are adjusted by applying a first voltage to the light adjusting layer for a first time period and applying a second voltage to the light adjusting layer for a second time period, and wherein during the first time period a first pattern is fabricated in the polymer or resist layer and during the second time period a second pattern is fabricated in the polymer or resist layer, the first pattern being different from the second pattern.

24. The method of claim 23 wherein at least one of the first and second patterns has a plurality of different non-zero slope angles.

25. The method of claim 23, wherein the light adjusting layer comprises a polymer dispersed liquid crystal layer.

26. The method of claim 23 further comprising placing a photomask above the polymer or resist layer.

* * * * *